(12) United States Patent
Murayama et al.

(10) Patent No.: US 8,836,119 B2
(45) Date of Patent: Sep. 16, 2014

(54) SEMICONDUCTOR DEVICE

(71) Applicant: Shinko Electric Industries Co., Ltd., Nagano (JP)

(72) Inventors: Kei Murayama, Nagano (JP); Akinori Shiraishi, Nagano (JP); Kenichi Mori, Grenoble (FR)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 0 days.

(21) Appl. No.: 13/958,828

(22) Filed: Aug. 5, 2013

(65) Prior Publication Data

US 2014/0042616 A1  Feb. 13, 2014

(30) Foreign Application Priority Data

Aug. 9, 2012  (JP) ................. 2012-177574

(51) Int. Cl.
*H01L 23/488* (2006.01)
*H01L 23/00* (2006.01)
*H01S 5/022* (2006.01)

(52) U.S. Cl.
CPC ............ *H01L 24/16* (2013.01); *H01S 5/02272* (2013.01)
USPC ........................................ 257/737

(58) Field of Classification Search
CPC ....................................... H01L 24/16
USPC .......................................... 257/737
See application file for complete search history.

(56) References Cited

U.S. PATENT DOCUMENTS 6,483,195 B1 * 11/2002 Aoki et al. .................... 257/778

FOREIGN PATENT DOCUMENTS

JP    2002-124524 A    4/2002

* cited by examiner

*Primary Examiner* — Daniel Shook
(74) *Attorney, Agent, or Firm* — Drinker Biddle & Reath LLP

(57) ABSTRACT

There is provided a semiconductor device. The semiconductor device includes: a silicon substrate; a copper post connected to one surface of the silicon substrate; a semiconductor element having a linear expansion coefficient different from that of the silicon substrate; a metal layer provided between the semiconductor element and the silicon substrate to cover the copper post; a first alloy layer provided between the copper post and the semiconductor element, wherein the first alloy layer includes alloy of gold and a metal of the metal layer; and a second alloy layer provided between the metal layer and the semiconductor element, wherein the second alloy layer includes alloy of gold and the metal of the metal layer.

6 Claims, 4 Drawing Sheets

SEMICONDUCTOR DEVICE

This application claims priority from Japanese Patent Application No. 2012-177574, filed on Aug. 9, 2012, the entire contents of which are herein incorporated by reference.

BACKGROUND

1. Technical Field

The present invention relates to a semiconductor device.

2. Description of the Related Art

In the related art, there is a wiring conductor layer where an adhesive metal layer, a first diffusion preventing layer, a main conductor layer made of Au, a second diffusion preventing layer made of Pt, a Sn layer, and a brazing filler metal layer made of Au-M (M is Sn, Si, or Ge) alloy are sequentially formed on an upper surface of an insulation substrate (see JP-A-2002-124524, for example).

Incidentally, when connecting substrates having different linear expansion coefficients to each other using an Au—Sn alloy, that is an alloy of gold (Au) and tin (Sn), and in a case where a stress is generated between the substrates by heating or heat generation, there are some cases that connection portions of the substrates are damaged.

In addition, there is a possibility that such damage similarly occurs in the connection portions in a case where a substrate and an element having different linear expansion coefficients and elements are connected to each other using an Au—Sn alloy, or in the connection portions in a case where elements having different linear expansion coefficients are connected to each other using an Au—Sn alloy.

Such damage to the connection portions, as described above, occurs as Au—Sn alloy has a very high hardness and the stress generated between the substrates is not absorbed. In addition, if the damage to the connection portion occurs, reliability of a device entirely decreases. Such a decrease in reliability similarly occurs in a semiconductor device as well.

SUMMARY OF THE INVENTION

According to one or more aspects of the present invention, there is provided a semiconductor device. The semiconductor device includes: a silicon substrate; a copper post connected to one surface of the silicon substrate; a semiconductor element having a linear expansion coefficient different from that of the silicon substrate; a metal layer provided between the semiconductor element and the silicon substrate to cover the copper post; a first alloy layer provided between the copper post and the semiconductor element, wherein the first alloy layer includes alloy of gold and a metal of the metal layer; and a second alloy layer provided between the metal layer and the semiconductor element, wherein the second alloy layer includes alloy of gold and the metal of the metal layer.

DETAILED DESCRIPTION

Figure 1A:
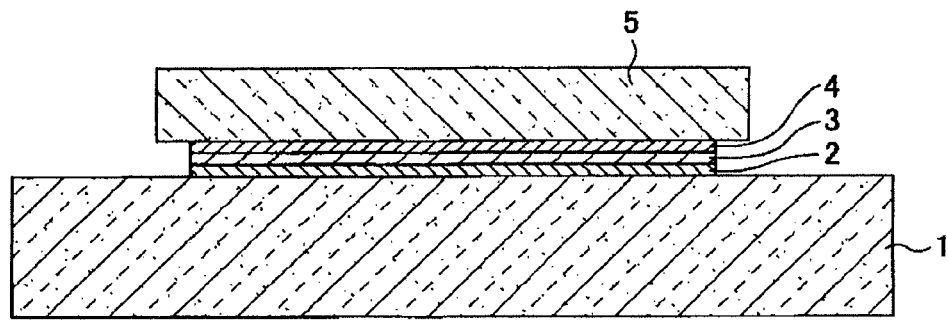
FIGS. 1A and 1B are cross-sectional views illustrating a semiconductor device of a comparative example.

Hereinafter, exemplary embodiments of the present invention will be now described with reference to the drawings. In each drawing, the same reference numeral is attached to the same component, and the overlapped descriptions may be omitted.

First, a description will be given to a semiconductor device of a comparative example with reference to FIGS. 1A and 1B.

<Comparative Example>

Figure 1B:
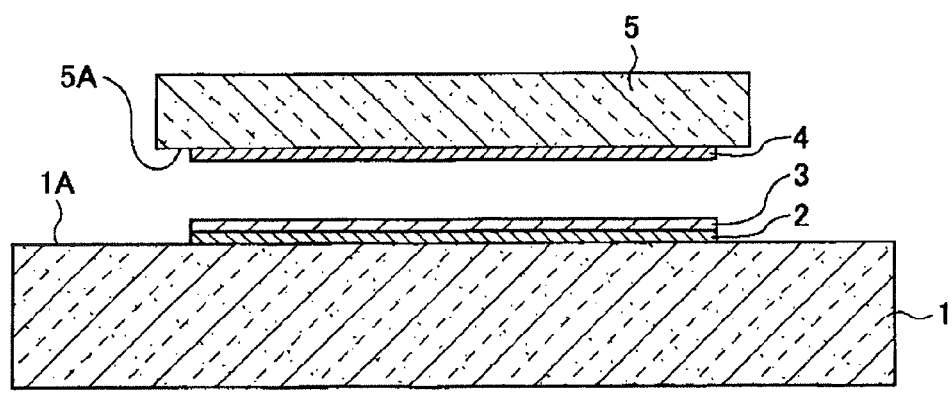

FIGS. 1A and 1B are cross-sectional views illustrating a semiconductor device of the comparative example. FIG. 1A illustrates a cross-section of a completed state of the comparative example, and FIG. 1B illustrates the cross-section of a state before bonding.

A semiconductor device 10 of the comparative example includes a silicon substrate 1, an adhesion layer 2, a solder layer 3, a plated layer 4, and a laser diode (LD) chip 5.

The silicon substrate 1, in which a wire and the like are formed in order to supply electric power to the LD chip 5, acts as a substrate holding the LD chip 5. The adhesion layer 2 and the solder layer 3 are formed on a surface 1A of the silicon substrate 1 in this order. The silicon substrate 1 is used because the workability and flatness thereof are excellent, and, the heat generation thereof is better compared to organic material-based substrates.

The adhesion layer 2 is formed on the surface 1A of the silicon substrate 1, and includes a plurality of metal layers. The adhesion layer 2 is obtained by forming a titanium (Ti) layer, a platinum (Pt) layer, and a gold (Au) layer on the surface 1A of the silicon substrate 1 in this order. The adhesion layer 2, for example, is formed by sputtering.

The solder layer 3 is an Au—Sn layer formed on the adhesion layer 2. The Au—Sn layer is an alloy layer obtained by forming an alloy of gold (Au) and tin (Sn) by plating. The solder layer 3, for example, is approximately 5 μm in thickness, which is significantly thicker compared to the thickness (for example, approximately 0.03 μm) of the adhesion layer 2.

The plated layer 4 is formed on the bottom surface 5A of the LD chip 5, and includes a plurality of metal layers. The plated layer 4 is obtained by forming a titanium (Ti) layer, a platinum (Pt) layer, and a gold (Au) layer on the bottom surface 5A of the LD chip 5 in this order by sputtering, and laminating a gold (Au) layer which is formed on the gold (Au) layer by plating. The plated layer 4, for example, is approximately 1 μm in thickness.

Moreover, the titanium (Ti) layer, the platinum (Pt) layer, and the gold (Au) layer in the plated layer 4 are adhesion layers, but they are not particularly distinguished in FIGS. 1A and 1B.

The LD chip 5, for example, is a substrate made of gallium nitride (GaN), a light-emitting layer and an electrode or the like are formed thereon, and, for example, is a blue laser diode. On the bottom surface of the LD chip 5, an electrode is formed and the plated layer 4 is connected to the electrode.

The plated layer 4 and the solder layer 3 are aligned, and then the LD chip 5 is bonded on the silicon substrate 1 by heating at 300° C. or higher through a reflow furnace, in a state where the LD chip 5 is placed on the silicon substrate 1. The adhesion layer 2, the solder layer 3, and the plated layer 4 are melted in the reflow furnace, then taken out of the reflow furnace, and then bonded by cooling.

The LD chip 5 is bonded to the silicon substrate 1 via the adhesion layer 2, the solder layer 3, and the plated layer 4. The adhesion layer 2, the solder layer 3, and the plated layer 4 are formed in order to ensure an electrical connection between the electrode of the LD chip 5 and the wire formed on the silicon substrate 1.

In addition, the adhesion layer 2, the solder layer 3, and the plated layer 4 not only align the LD chip 5 with respect to the silicon substrate 1 but also act as thermal paths for emitting the heat generated by the LD chip 5 to the silicon substrate 1, in addition to ensuring the electrical connection.

When the adhesion layer 2, the solder layer 3, and the plated layer 4 are melted by reflow treatment, an alloy of metals, which is included in each layer, is generated near the interface of each layer. However, since the solder layer 3, which is an Au—Sn layer, is a main body, the Au—Sn layer remains even after the reflow treatment.

Incidentally, the silicon substrate 1 and the LD chip 5, which is a gallium nitride substrate, have significantly different liner expansion coefficients. The linear expansion coefficient of the silicon substrate 1 is approximately $2.4 \times 10^6 \text{ K}^{-1}$, and the linear expansion coefficient of gallium nitride is approximately $3.17 \times 10^6 \text{K}^{-1}$.

For this reason, a stress (thermal stress) is generated between the silicon substrate 1 and the LD chip 5 by the heat generated when the LD chip 5 emits light and by the difference in linear expansion coefficient.

However, since the Au—Sn layer included in the adhesion layer 2 has a high hardness, there is a case where the Au—Sn layer is broken without absorbing the stress occurred between the silicon substrate 1 and the LD chip 5.

The Au—Sn layer is suitable for bonding elements such as the LD chip 5 accompanied by heat generation since a melting point thereof is higher among the plating materials, but there is a problem in that it is difficult to use it in an environment where a stress is generated due to the high hardness thereof.

As described above, in the semiconductor device 10 of the comparative example, there is a disadvantage in that the Au—Sn layer included in the adhesion layer 2 is broken by the stress generated between the silicon substrate 1 and the LD chip 5, which is caused by heat generation of the LD chip 5. If the adhesion layer 2 is broken, since the semiconductor device 10 is damaged, a problem that reliability of the semiconductor device 10 decreases is generated.

Accordingly, in the embodiment described below, an object of the present invention is to provide a semiconductor device that solves the above-mentioned disadvantages.

Embodiment

Figure 2A:
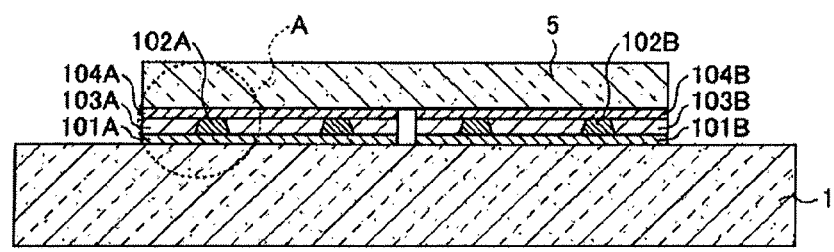
FIGS. 2A to 2C are views illustrating a semiconductor device 100 of an embodiment.
Figure 2B:
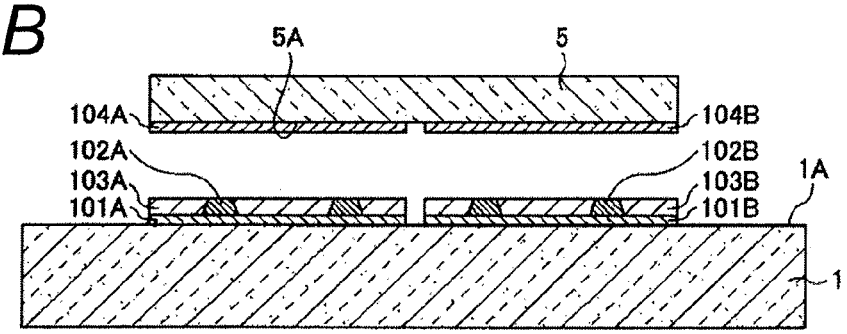

FIGS. 2A and 2B are views illustrating a semiconductor device 100 of the embodiment. FIG. 2A illustrates a cross-section of a completed state, FIG. 2B illustrates a cross-section of a state before bonding, and FIG. 2C illustrates a cross-section of an enlarged portion indicated by a broken line A of FIG. 2A.

The semiconductor device 100 includes a silicon substrate 1, adhesion layers 101A and 101B, copper posts 102A and 102B, indium layers 103A and 103B, plated layers 104A and 104B, and the LD chip 5. The silicon substrate 1 and the LD chip 5 is the same as the silicon substrate 1 and the LD chip 5 of the semiconductor device 10 of the comparative example. In addition, an insulator film is formed on the surface of the silicon substrate 1.

Figure 2C:
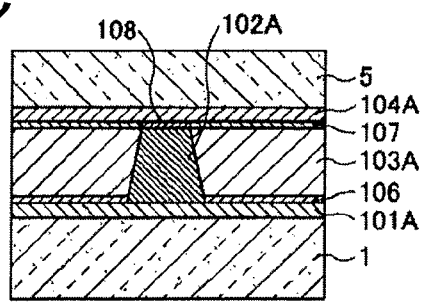

In the semiconductor device 100 of the embodiment, the adhesion layers 101A and 101B, the copper posts 102A and 102B, the indium layers 103A and 103B, and the plated layers 104A and 104B are separated respectively in a width direction (transverse direction) in FIGS. 2A to 2C.

This, for example, is to connect positive terminals of the LD chip 5 to the wire and the like formed on the silicon substrate 1 by an adhesion layer 101A, a copper post 102A, a indium layer 103A, and a plated layer 104A. In addition, this is also to connect a negative terminal of the LD chip 5 to the wire and the like formed on the silicon substrate 1 by the adhesion layer 101B, the copper post 102B, the indium layer 103B, and the plated layer 104B.

However, hereinafter, in a case where the adhesion layers 101A and 101B, the copper posts 102A and 102B, the indium layers 103A and 103B, the plated layers 104A and 104B are not particularly distinguished, reference will be simply made as an adhesion layer 101, a copper post 102, an indium layer 103, and a plated layer 104.

In addition, hereinafter, the semiconductor device 100 of the embodiment will be described as including the LD chip 5, but the semiconductor device 100 in a state of not including the LD chip 5 (and plated layer 104) will be also treated as a semiconductor device.

The adhesion layers 101A and 101B are formed on the surface 1A of the silicon substrate 1. The adhesion layers 101A and 101B are seed layers for forming the copper post 102. The adhesion layers 101A and 101B, for example, are formed on the surface 1A of the silicon substrate 1 by sputtering or electroless plating treatment.

The copper posts 102A and 102B are respectively manufactured on the adhesion layers 101A and 101B by performing the electroless plating treatment and forming a copper plated film, using a resist (not shown). The copper posts 102A and 102B, here, as an example, are frustoconical copper plated films, but their shapes are not limited as long as the shapes are in post shapes and have certain heights.

In addition, the copper posts 102A and 102B may be at least one respectively, but a cross section in a state where two are arranged in the width direction (transverse direction) is illustrated in FIGS. 2A to 2C. In addition, the copper posts 102A and 102B may be arranged in a matrix manner in a plan view. Both of the copper posts 102A and 102B may have same heights.

The indium layers 103A and 103B are formed on the adhesion layer 101A and the copper post 102A, and on the adhesion layer 101B and the copper post 102B respectively. The indium layers 103A and 103B, for example, may be formed by pasting two indium sheets on the adhesion layer 101A and the copper post 102A, and on the adhesion layer 101B and the copper post 102B respectively.

The shape of the indium sheets are changed according to the convex-shaped copper posts 102A and 102E since they have lower hardness and are softer than the copper posts 102A and 102B, and thus it is possible to cover a top surface and side surfaces of the copper posts 102A and 102B. Moreover, in this case, the indium sheets (indium layers 103A and 103B) may coat the top surfaces (apex) of the copper posts 102A and 102B, and may expose the top surfaces (apex) of the copper posts 102A and 102B, respectively.

Moreover, here, the apexes of the copper posts 102A and 102B are described as those that are coated by very thin indium layers 103A and 103B.

In addition, hardness may be a modulus of elasticity of the material, which is represented by Young's modulus (modulus of longitudinal elasticity), and may also be a degree of hardness, which is represented by other indexes or physical properties (for example, stiffness rate, etc.).

In addition, the indium layers 103A and 103B may be formed by performing the plating treatment, instead of indium sheets. In this case, each of the indium plated layers (indium layers 103A and 103B) may coat the top surfaces (apex) of the copper posts 102A and 102B, and may expose the apexes of the copper posts 102A and 102B.

The plated layers 104A and 104B are formed on a bottom surface 5A of the LD chip 5. The plated layers 104A and 104B are configured to separate the plated layer 4 of the comparative example at the center portion, in the width direction (transverse direction) of the cross-section.

The plated layers 104A and 104B are obtained by forming a titanium (Ti) layer, a platinum (Pt) layer, and a gold (Au) layer on the bottom surface 5A of the LD chip 5 in this order by sputtering and forming a gold (Au) layer which is formed on the gold (Au) layer by the plating treatment. Moreover, the titanium (Ti) layer, the platinum (Pt) layer, and the gold (Au) layer in the plated layers 104A and 104B are adhesion layers, but they are not particularly distinguished in FIGS. 2A to 2C.

The semiconductor device 100 of the embodiment, as illustrated in FIG. 2B, is manufactured by aligning the adhesion layer 101A and the copper post 102A, the adhesion layer 101B and the copper post 102B, and the plated layers 104A and 104B, and by performing the reflow treatment in a state where the LD chip 5 is placed on the silicon substrate 1.

The LD chip 5 is bonded to the silicon substrate 1 by hearing the LD chip 5 and the silicon substrate 1 to 300° C. or higher in a reflow furnace. The adhesion layer 2, the solder layer 3, and the plated layer 4 are melted in the reflow furnace, then are taken out of the reflow furnace, and then are bonded by cooling.

The adhesion layers 101A and 101B, the copper posts 102A and 102B, the indium layers 103A and 103B, and the plated layers 104A and 104B are melted in the reflow furnace, thereby producing an alloy at respective interfaces.

As illustrated in FIG. 2C, the gold (Au) layer, which is the top layer of the adhesion layer 101A, and indium (In) are melted between the adhesion layer 101A and the indium layer 103A, thereby forming an Au—In alloy layer 106.

Moreover, between the adhesion layer 101A and the indium layer 103A, there is a case where an $AuIn_2$ alloy is formed, in addition to the Au—In alloy layer 106. The $AuIn_2$ alloy is produced in a state where indium is abundant. The $AuIn_2$ alloy is formed on the indium layer 103A side rather than the Au—In alloy layer 106.

In addition, a gold (Au) layer, which is the bottom layer of the plated layer 104A, and indium (In) are melted between the indium layer 103A and the plated layer 104A, thereby forming an Au—In alloy layer 107.

In addition, there is a case where the $AuIn_2$ alloy is formed between the indium layer 103A and the plated layer 104A, similarly to the case between the adhesion layer 101A and the indium layer 103A. The $AuIn_2$ alloy is produced in a state where indium is abundant.

Moreover, since the reflow treatment is performed between the copper post 102A and the plated layer 104A via the indium layer 103A, an alloy layer 108 is formed on the copper post 102A. The alloy layer 108 is a laminate of a Cu—In alloy layer formed on the copper post 102A side (bottom side) and an Au—In alloy layer formed on the plated layer 104A side (top side).

The Cu—In alloy layer is an alloy layer of copper (Cu) of the copper post 102A and indium (In) of the indium layer 103A.

Moreover, there is a case where a $CuIn_2$ alloy is formed between the copper post 102A and the plated layer 104A, in addition to the Cu—In alloy layer. The $CuIn_2$ alloy layer is produced in a state where indium is abundant.

Moreover, the Au—In alloy layer formed on the plated layer 104A side (top side) is an alloy layer of indium (In) of the indium layer 103A positioned between the copper post 102A and the plated layer 104A, and gold (Au) of the bottom layer of the plated layer 104A. The Au—In alloy layer included in the alloy layer 108 is the same alloy layer as the Au—In alloy layers 106 and 107. Moreover, there is a case where a gold layer (gold film) remains in the plated layer 104A even after the Au—In alloy layer 107 and the alloy layer 108 are formed.

In addition, there is a case where $AuIn_2$ alloy is formed between the copper post 102A and the plated layer 104A, similarly to the case between the adhesion layer 101A and the indium layer 103A and the case between indium layer 103A and the plated layer 104A. The $AuIn_2$ alloy is produced in a state where indium is abundant.

Moreover, in FIG. 2C, a description is given with regard to an alloy that is produced at the interface of the adhesion layer 101A, the copper layer 102A, the indium layer 103A, and the plated layer 104A by the reflow treatment. However, the same alloy is produced also at the interface of the adhesion layer 101B, the copper post 102B, the indium layer 103B, and the plated layer 104B by the reflow treatment.

When the reflow treatment described above is completed, the semiconductor device 100 including a cross sectional configuration illustrated in FIG. 2A is completed.

The LD chip 5 and the silicon substrate 1 are connected to each other in the semiconductor device 100 by the adhesion layer 101, the copper post 102, the indium layer 103, and the plated layer 104.

The LD chip 5 is positioned with respect to the silicon substrate 1 by the copper post 102 while being held on the silicon substrate 1 by the indium layer 103.

The temperature of the LD chip 5, for example, increases to approximately 180° C. by due to the lighting of the LD chip 5. However, since melting point of copper (Cu), which is a component of the copper post 102, is 1084.6° C., the copper post 5 does not melt by heat generated due to the lighting of the LD chip 5.

In addition, the melting point of gold (Au) is 1064.4° C., the melting point of platinum (Pt) is 1768.3° C., the melting point of titanium (Ti) is 1668° C., the melting point of the $AuIn_2$ alloy is 495° C., and the melting point of $CuIn_2$ alloy is 308° C. to 389° C.

For this reason, each layer of gold (Au), platinum (Pt), titanium (Ti), the $AuIn_2$ alloy, and the $CuIn_2$ alloy does not melt by the heat generated due to the lighting of the LD chip 5.

In addition, the Au—In alloy layer is in a state where gold (Au) and indium (In) are mixed, and does not melt by the heat generated due to the lighting of the LD chip 5 since the melting point of gold is 1064.4° C.

Similarly, Cu—In is in a state where copper (Cu) and indium (In) are mixed, and does not melt by the heat generated due to the lighting of the LD chip 5 since the melting point of Cu is 1084.6° C.

For this reason, the adhesion layer 101, the copper post 102, the plated layer 104, the Au—In alloy layers 106 and 107, and the alloy layer 108 do not melt by the heat generated due to the lighting of the LD chip 5. That is, among the elements between the silicon substrate 1 and the LD chip 5 of the semiconductor device 100, the elements other than the indium layer 103 does not melt by the heat generated due to the lighting of the LD chip 5.

Here, for example, if temperature increases to approximately 180° C. due to the lighting of the LD chip 5, the indium layer 103 melts (or soften) since the melting point of indium (In), which is a component of the indium layer 103, is 156° C.

However, the indium layer 103 is approximately 5 μm to 70 μm in thickness, even if melting, remains by surface tension between the silicon substrate 1 and the LD chip 5, and do not leak out from between the silicon substrate 1 and the LD chip 5. The thickness of the indium layer 103 is determined by the height of the copper post 102.

Then, the indium layer 103 holds the LD chip 5 with respect to the silicon substrate 1 via the adhesion layer 101, the plated layer 104, the Au—In alloy layers 106 and 107, even when melting.

In addition, if the LD chip 5 is turned off and temperature decreases, the indium layer 103 solidifies in the same position as before melting. Then, even though the indium layer 103 is re-melted due to heat generated by the lighting of the LD chip 5, the indium layer re-solidifies after LD chip 5 is turned off, and thus the operation is repeated.

Accordingly, even though a stress due to a difference between the linear expansion coefficients of the silicon substrate 1 and that of the GaN substrate of the LD chip 5 occurs between the silicon substrate 1 and the LD chip 5, associated with heat generated due to the lighting of the LD chip 5, the copper post 102 and the indium layer 103 absorb the stress.

Since the copper post 102 has a certain height, the copper post 102 can absorb the stress by bending in the width direction (transverse direction) in FIG. 2A, even though the LD chip 5 is expanded more than the silicon substrate 1. In other words, a moving range of the copper post 102 is extended. Moreover, the height of the copper post 102 may be long enough to absorb the thermal stress between the silicon substrate 1 and the LD chip 5. The height of the copper post 102, for example, may be approximately 5 μm to 70 μm. In addition, the copper post 102 may have an aspect ratio large enough to absorb the thermal stress between the silicon substrate 1 and the LD chip 5, in addition to the above-mentioned height.

In addition, since the indium layer 103 has hardness lower than the copper post 102 and further melts, the indium layer 103 can absorb the stress by bending in the width direction (transverse direction) in FIG. 2A, even though the LD chip 5 is expanded more than the silicon substrate 1.

Moreover, there may be a case where the indium layer 103 does not melt, because the increase in temperature, which is caused by the lighting of the LD chip 5, is lower than the above case. Even in a case where the indium layer 103 does not melt in this manner, since the indium layer 103 has a lower hardness and is softer than the copper post 102, and thus the indium layer 103 can absorb the stress by bending in the width direction (transverse direction) in FIG. 2A, even though the LD chip 5 is expanded more than the silicon substrate 1.

As described above, according to the semiconductor device 100 of the embodiment, since it is possible to absorb the stress which occurs between the silicon substrate 1 and the LD chip 5 by the copper post 102 and the indium layer 103, it is possible to suppress the occurrence of breaks and the like between the silicon substrate 1 and the LD chip 5.

As a result, according to the embodiment, it is possible to provide the semiconductor device 100 having high reliability.

Moreover, a description was to the embodiment that the LD chip 5 is bonded to the silicon substrate 1 by the reflow treatment, in a state where the indium layer 103 is present between the copper post 102 and the plated layer 104.

However, when the reflow treatment is performed in a state where the indium layer 103 is not present between the copper post 102 and the plated layer 104 (that is, in a state where the apex of the copper post 102 is exposed from the indium layer 103), the alloy layer 108 is an alloy (Au—Cu) of copper (Cu) of the copper post 102 and gold (Au) of the bottom layer of the plated layer 104A.

The alloy Au—Cu has a sufficiently high melting point and does not melt by the heat generated from LD chip 5. Thus, it is possible to obtain a high-reliability semiconductor device 100 even in a case where the apex of the copper post 102 is exposed from the indium layer 103.

In addition, a description was given to the embodiment where the indium layer 103 is used, however, a gallium layer, tin layer, or an alloy layer containing indium, gallium, or tin may be used instead of the indium layer 103.

A metal layer that can be used instead of the indium layer 103 may be a metal that has hardness lower than copper (Cu) of the copper post 102.

For example, a low-melting-point metal may be used. A low-melting-point metal may be a metal that has a melting point lower than each melting point of gold (Au), titanium (Ti), platinum (Pt), Cu—In alloy, Au—In alloy, $CuIn_2$ alloy and $AuIn_2$ alloy contained in the semiconductor device 100. It is more preferably that the metal is melted by heat generated due to the lighting of the LD chip 5.

A metal may be used instead of the indium layer 103, which has such a low melting point, solidifies after melting, and re-solidifies without leaking out from between the silicon substrate 1 and the LD chip 5 even if re-melting. Moreover, an alloy containing gallium, tin, or an alloy containing indium, gallium, or tin is an example of such low-melting-point metals.

In addition, a description was given to the embodiment that the LD chip 5 is used as a semiconductor element mounted on a silicon substrate. However, the semiconductor element is not limited to the LD chip 5. Another semiconductor element may be used as the semiconductor element, in addition to the LD chip 5.

In addition, a description was given to the embodiment that a silicon substrate is used. However, a copper tungsten (CuW) substrate, a CMC (Cu—Mo—Cu) substrate, or a silicon carbide (SiC) substrate may be used instead of the silicon substrate.

In addition, the adhesion layers 101A and 101B may not be formed in a region other than a region where the copper posts 102A and 102B are formed. The modified example will be described with reference to FIG. 3.

Figure 3:
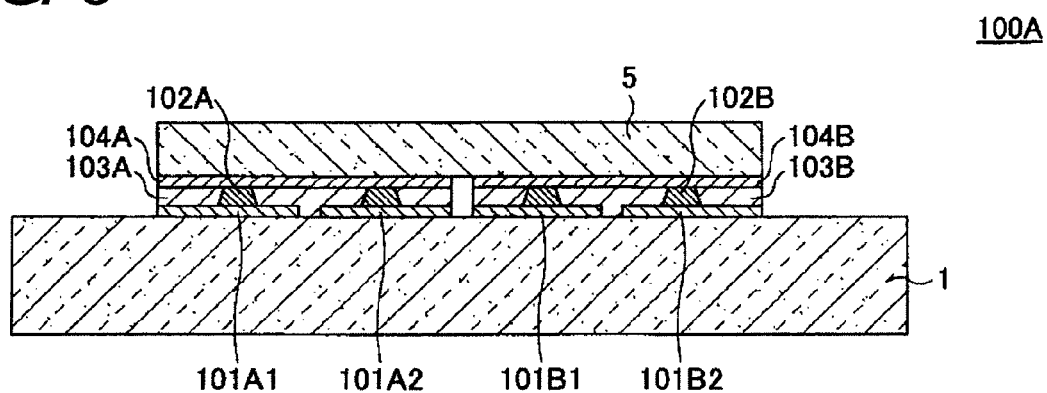
FIG. 3 is a cross-sectional view illustrating a semiconductor device 100A of a modified example of the embodiment.

FIG. 3 is a cross-sectional view illustrating a semiconductor device 100A of the modified example of the embodiment. The cross-section illustrated in FIG. 3 corresponds to the cross-section illustrated in FIG. 2A.

In the semiconductor device 100A illustrated in FIG. 3, the adhesion layer 101A illustrated in FIG. 2A is separated into the adhesion layer 101A1 and the adhesion layer 101A2 while the adhesion layer 101B illustrated in FIG. 2A is separated into the adhesion layer 101B1 and the adhesion layer 101B2.

That is, the semiconductor device 100A according to the modified example of the embodiment includes the adhesion layers 101A1, 101A2, 101B1, and 101B2, instead of the adhesion layers 101A and 101B, which are illustrated in FIG. 2A.

The adhesion layers 101A1, 101A2, 101B1, and 101B2 divides the adhesion layers 101A and 101B illustrated in FIG. 2A into two respectively, corresponding to each of the four copper posts 102A and 102B arranged in the width direction.

In the semiconductor device 100A, the indium layers 103A and 103B are in a direct contact with the silicon substrate 1 in a portion where the adhesion layers 101A1, 101A2, 101B1, and 101B2 are not formed.

Even when the configuration is changed as described above, since it is possible to absorb stress which occurs between the silicon substrate 1 and the LD chip 5 by the copper posts 102A and 102B and the indium layers 103A and 103B, it is possible to suppress the occurrence of breaks and the like between the silicon substrate 1 and the LD chip 5.

As a result, in the modified example of the embodiment, it is possible to provide the high-reliability semiconductor device 100A.

Moreover, nickel (Ni) plating and gold (Au) plating may be formed on the surface (top surface) of the adhesion layer 101, or the top surface and the side surfaces of the copper post 102 in this order. In this case, nickel (Ni) plating and gold (Au) plating are formed on the surface of the adhesion layer 101 or the copper post 102 in this order.

Accordingly, when the reflow treatment is performed, at the interface of the indium layer 103, a Ni—In alloy layer and the Au—In alloy layer are formed on the surface of the adhesion layer 101 or the copper post 102 in this order.

The Ni—In alloy layer and the Au—In alloy layer are formed instead of the Cu—In alloy layer formed at the interface of the indium layer 103 in a case where the Ni—In alloy layer and the Au—In alloy layer are not formed on the surface of the copper in the adhesion layer 101 or the copper post 102. That is, the Cu—In alloy layer is rarely formed on the surface of the copper in the adhesion layer 101 or the copper post 102 in a case where nickel (Ni) plating and gold (Au) plating are formed.

In a case where nickel (Ni) plating and gold (Au) plating are formed on the surface of the copper in the adhesion layer 101 or the copper post 102, it is possible to suppress diffusion into the alloy layer of the copper in the adhesion layer 101 or the copper post 102. For this reason, at the interface of the adhesion layer 101, the copper post 102, and the indium layer 103, a possibility that voids occur can be suppressed, and a long-term reliability can be improved.

Moreover, in a case where there is no possibility that such voids occur, nickel (Ni) plating and gold (Au) plating may not be formed on the surface of the adhesion layer 101 (top surface) or the top surface and side surfaces of the copper post 102.

Figure 4:
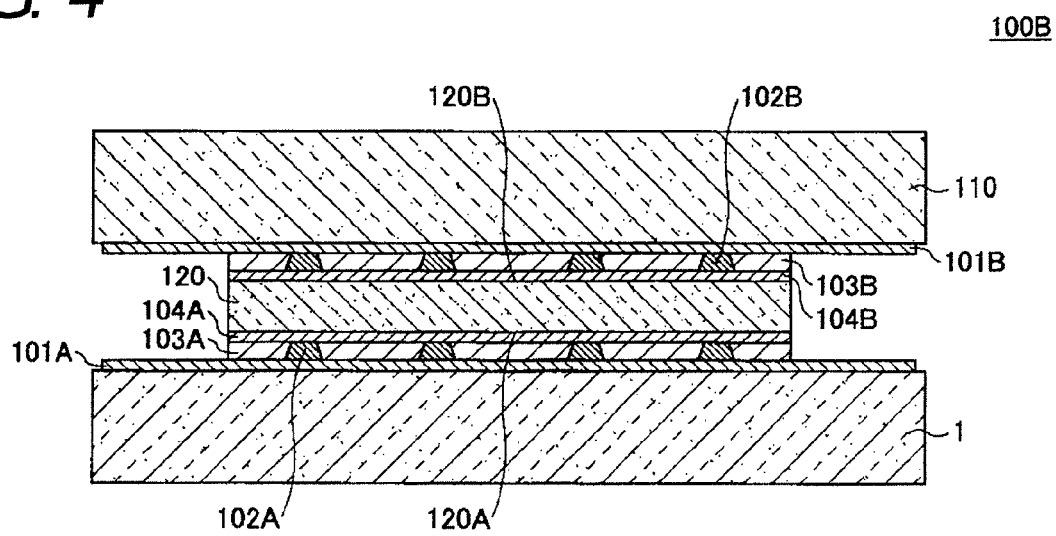
FIG. 4 is a cross-sectional view illustrating a semiconductor device 100B of another modified example of the embodiment.

In addition, in a case where positive terminals and negative terminals of the LD chip 5 are formed on the top surface and the bottom surface 5A of the LD chip 5(see FIG. 2A), the semiconductor device 100 (see FIG. 2A) of the embodiment may be changed as illustrated in FIG. 4.

FIG. 4 is a cross-sectional view illustrating a semiconductor device 100B of another modified example of the embodiment.

The semiconductor device 100B further includes both an LD chip 120 instead of the LD chip 5 illustrated in FIG. 2A and a silicon substrate 110.

The LD chip 120 has positive terminals on the bottom surface 120A and has negative terminals on the top surface 120B. In addition, the LD chip 120, as indicated by an arrow in the figure, is a laser diode that emits a laser beam from the side.

In the semiconductor device 100B illustrated in FIG. 4, elements (the adhesion layer 101B, the copper post 102B, the indium layer 103B, and the plated layer 104B), which are connected to the negative terminal of the LD chip 5 in the semiconductor device 100 illustrated in FIG. 2A are arranged between the top surface 120B of the LD chip 120 and the silicon substrate 110.

Moreover, in FIG. 4, the width of the adhesion layers 101A and 101B, the copper posts 102A and 102B, the indium layers 103A and 103B, and the plated layers 104A and 104B are extended in a width direction of the semiconductor device 100B.

That is, the adhesion layers 101A and 101B, the copper posts 102A and 102B, the indium layers 103A and 103B, and the plated layers 104A and 104B are formed over the region approximately twice the width, compared to the semiconductor device 100A illustrated in FIG. 2A.

In the semiconductor device 100B, the positive terminal on the bottom side 120A of the LD chip 120 is connected to the wire and the like of the silicon substrate 1 via the adhesion layer 101A, the copper post 102A, the indium layer 103A, and the plated layer 104A.

In addition, the negative terminal on the top surface 120B of the LD chip 120 is connected to the wire and the like of a silicon substrate 110 via the adhesion layer 101B, the copper post 102B, the indium layer 103B, and the plated layer 104B.

Then, the LD chip 120 emits a laser beam in the transverse direction from between the silicon substrate 1 and the silicon substrate 110 by receiving power via the positive terminal and the negative terminal.

Then, even though the LD chip 120 generates heat due to the laser beam, the copper posts 102A and 102B, the indium layers 103A and 103B absorb the stress between the silicon substrates 1 and 110, and the LD chip 120.

As a result, it is possible to suppress occurrence of break and the like generated between the silicon substrates 1 and 110, the LD chip 120.

As a result, in another modified example of the embodiment, it is possible to provide the high-reliability semiconductor device 100B.

In addition, the LD chip 5 may be mounted on the silicon substrate 1 in a state of facing up thereon. The modified example will be described with reference to FIG. 5.

Figure 5:
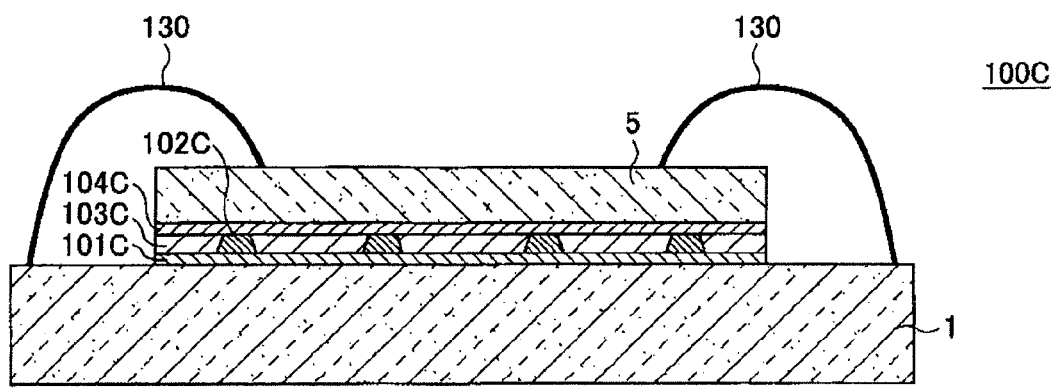
FIG. 5 is a cross-sectional view illustrating a semiconductor device 100C of another modified example of the embodiment.

FIG. 5 is a cross-sectional view illustrating a semiconductor device 100C of another modified example of the embodiment.

In the semiconductor device 100C illustrated in FIG. 5, the LD chip 5 is mounted, on the surface of the silicon substrate 1 in a state of facing up thereon. The LD chip 5 illustrated in FIG. 5 is connected to the wire and the like of the silicon substrate 1 by a bonding wire 130.

In addition, the LD chip 5 is fixed to the surface of the silicon substrate 1 by an adhesion layer 101C, a copper post 102C, an indium layer 103C, and the plated layer 104.

The adhesion layer 101C, the copper post 102C, the indium layer 103C, and the plated layer 104C are the same as the adhesion layers 101A and 101B, the copper posts 102A and 102B, the indium layers 103A and 103B, and the plated layers 104A and 104B illustrated in FIG. 2, respectively.

Here, since the electrical connection of the LD chip 5 and the wire and the like of the silicon substrate 1 is performed by a bonding wire 130, the adhesion layer 101C, the copper post 102C, the indium layer 103C, and the plated layer 104C are not involved in the electrical connection with the silicon substrate 1 and the LD chip 5.

The adhesion layer 101C, the copper post 102C, the indium layer 103C, and the plated layer 104C fix the LD chip 5 to the silicon substrate 1. In addition, among them, the copper post 102C and the indium layer 103C absorb the stress that occurs between the silicon substrates 1 and the LD chip 5, which is caused by heat generation from the LD chip 5.

Accordingly, in the semiconductor device 100C illustrated in FIG. 5, it is possible to suppress occurrence of break and the like between the silicon substrate 1 and the LD chip 5.

In this manner, the adhesion layer 101C, the copper post 102C, the indium layer 103C, and the plated layer 104C may not necessarily be involved in the electrical connection of the LD chip 5.

As described above, the preferred embodiment and the modifications are described in detail. However, the present invention is not limited to the above-described embodiment and the modifications, and various modifications and replacements are applied to the above-described embodiment and the modifications without departing from the scope of claims.

What is claimed is:

1. A semiconductor device comprising:
   a silicon substrate;
   a copper post connected to one surface of the silicon substrate;
   a semiconductor element having a linear expansion coefficient different from that of the silicon substrate;
   a metal layer provided between the semiconductor element and the silicon substrate to cover the copper post;
   a first alloy layer provided between the copper post and the semiconductor element, wherein the first alloy layer comprises alloy of gold and a metal of the metal layer; and
   a second alloy layer provided between the metal layer and the semiconductor element, wherein the second alloy layer comprises alloy of gold and the metal of the metal layer.

2. The semiconductor device of claim 1,
   wherein the metal layer is softened by heat generated from the semiconductor element so as to increase a moving range of the copper post.

3. The semiconductor device of claim 1,
   wherein the metal layer is made of indium, gallium, or tin.

4. The semiconductor device of claim 1,
   wherein the first alloy layer further comprises alloy of copper and the metal of the metal layer.

5. The semiconductor device of claim 1,
   wherein the copper post comprises: a first copper post; and a second copper post,
   wherein the metal layer comprises: a first metal layer covering the first copper post; and a second metal layer covering the second copper post, wherein the first metal layer is separated from the second metal layer.

6. The semiconductor device of claim 1, further comprising:
   a gold film provided between the first and second alloy layers and the semiconductor element.

* * * * *